(12) United States Patent
Lin et al.

(10) Patent No.: US 6,541,339 B1
(45) Date of Patent: Apr. 1, 2003

(54) NITRIDE DEPOSITION WAFER TO WAFER NATIVE OXIDE UNIFORMITY IMPROVEMENT FOR 0.35 FLASH ERASE PERFORMANCE BY ADDING THERMAL OXIDE OXIDATION PROCESS

(75) Inventors: Chih-Hao Lin, Banchiau (TW); Bu-Fang Chen, Taipei (TW); Fei-Wen Cheng, Hsinchu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/081,972

(22) Filed: Feb. 21, 2002

(51) Int. Cl.$^7$ .......................................... H01L 21/8247
(52) U.S. Cl. ..................... 438/266; 438/593; 438/907
(58) Field of Search ................... 438/257–267, 438/593–594, 907

(56) References Cited

U.S. PATENT DOCUMENTS

| 5,652,161 | A |   | 7/1997  | Ahn ............................. 437/43 |
| 6,090,668 | A | * | 7/2000  | Lin et al. ..................... 438/266 |
| 6,184,088 | B1 | * | 2/2001  | Kurooka et al. ............. 438/264 |
| 6,225,162 | B1 |   | 5/2001  | Lin et al. ..................... 438/261 |
| 6,242,308 | B1 |   | 6/2001  | Hsieh et al. ................. 438/265 |
| 6,261,905 | B1 |   | 7/2001  | Chen et al. .................. 438/264 |
| 6,284,596 | B1 |   | 9/2001  | Sung et al. .................. 438/257 |
| 6,333,228 | B1 | * | 12/2001 | Hsieh et al. ................. 438/257 |

\* cited by examiner

*Primary Examiner*—Richard Booth
(74) *Attorney, Agent, or Firm*—George O. Saile; Stephen B. Ackerman

(57) ABSTRACT

A new method is provides for the creation of a hardmask over a layer of polysilicon for the etching of floating gate for split-gate flash memory devices. A layer of gate oxide is created over the surface of a substrate, a layer of polysilicon is deposited over the surface of the layer of gate oxide. In a first embodiment of the invention, a layer of native oxide is grown over the surface of the layer of gate material, this layer of gate oxide is used to enhance oxidation of exposed portions of the layer of gate material. In a second embodiment of the invention, enhanced oxidation of exposed portions of the layer of polysilicon is achieved by modifying the conventional sequence of the oxidation process. This latter modification is realized by modifying the forward motion of the substrates through the oxidation furnace or by modifying the sequence in which the substrates move through the oxidation furnace.

48 Claims, 5 Drawing Sheets

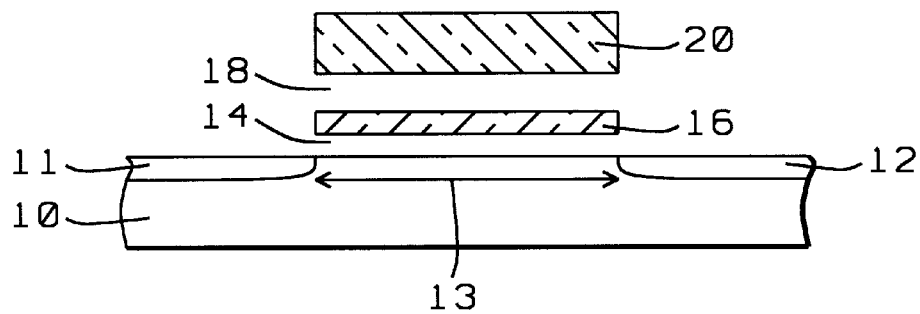
FIG. 1 – Prior Art
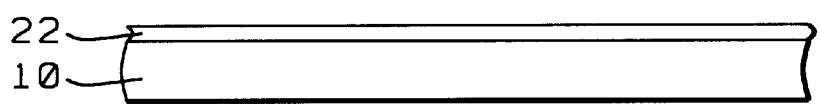
FIG. 2a – Prior Art
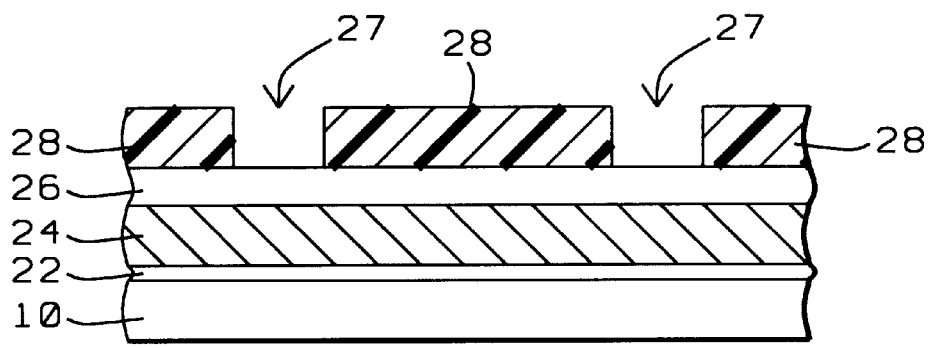
FIG. 2b – Prior Art

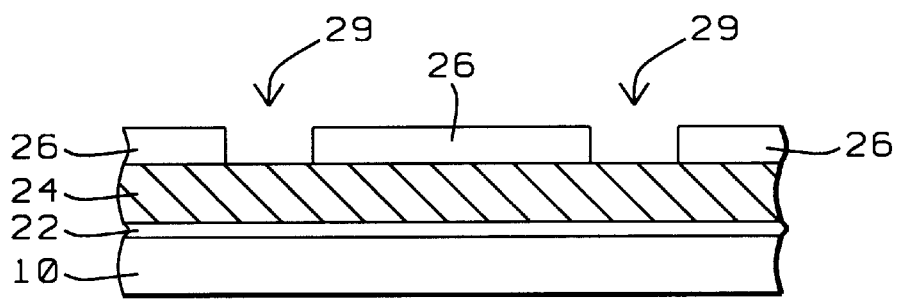
FIG. 2c – Prior Art
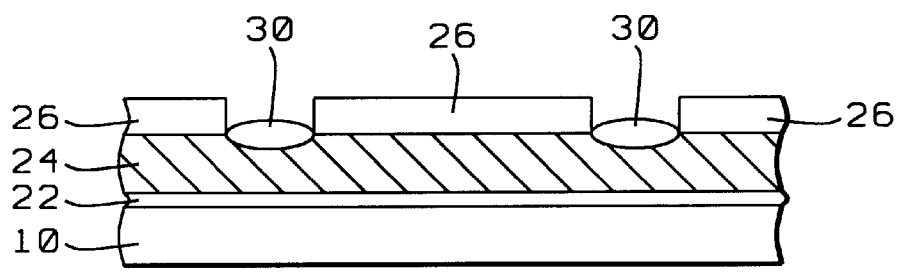
FIG. 2d – Prior Art
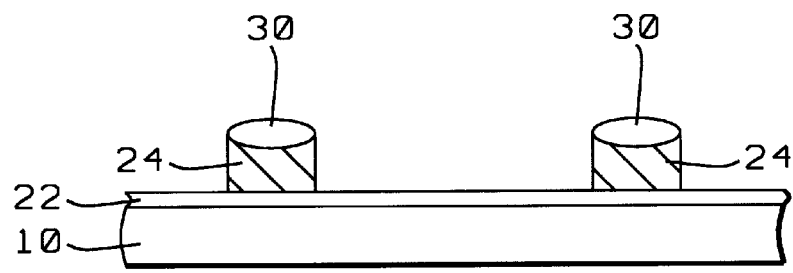
FIG. 2e – Prior Art

NITRIDE DEPOSITION WAFER TO WAFER NATIVE OXIDE UNIFORMITY IMPROVEMENT FOR 0.35 FLASH ERASE PERFORMANCE BY ADDING THERMAL OXIDE OXIDATION PROCESS

BACKGROUND OF THE INVENTION (1) Field of the Invention

The invention relates to the fabrication of integrated circuit devices, and more particularly, to a method to enhance uniformity in thickness of created layers of native oxide.

(2) Description of the Prior Art

The functionality of semiconductor devices can be roughly divided into logic or data manipulation functions and storage or data retention functions. In the latter category fall Read Only Memory (ROM) devices also referred to as mask-programmed devices. ROM devices are non-volatile memories, data is permanently stored in the devices during the fabrication of the devices through the use of custom masks. A desired bit pattern of the memory retained in the ROM device, each bit pattern is provided for one particular application of the ROM device. Only read operations can be performed, changes of the data contained in the memory cannot be made after the device has been fabricated. Customization of the device is however economically feasible since only one mask needs to be used for the fabrication of the ROM device. ROM devices have been implemented using bipolar and CMOS technologies. A typical application of ROM devices is in the interface between central processors and other therewith connected data processing devices. The ROM devices are used for the elimination of system "wait" states and hence to improve the operational speed of the data processing system.

Different data are stored in a ROM device by the presence or the absence of a conductive data path between a word line (the access path of the memory) to a bit line (the sense line of the memory). No data element will be provided if the word line and the bit line are not interconnected by a circuit element if therefore the word line of a ROM is activated, the presence of a signal on the bit line indicates that a "1" is stored in that data element (bit location). The absence of a signal on the bit line indicates that a "0" is stored in that bit location. The implementation of the ROM device uses either a complement of NOR function or a complement of NAND function. The imbedding of data in ROM devices (zero or one bit conditions) takes place by selectively omitting a contact.

Field-programmable ROM (PROM) devices are ROM devices that are typically manufactured in small quantities, these devices are programmed individually in order to save overall manufacturing costs. Some ROM devices are manufactured such that data, once entered into the device, cannot be erased. Other ROM devices allow the data to be erased and to be re-entered after the device has been manufactured. Initially, such devices have predominantly been created using bipolar technology, more recent developments use MOS technology for the creation of these devices. The Erasable PROM (EPROM) devices depend on the long-term retention of data, this data is retained as an electronic charge and is stored on a polysilicon gate of a MOS device. The term "floating" in this structure refers to the fact that no electrical connection exists to the gate that retains the electrical charge. The charge is therefore transferred from the silicon substrate through an insulator. In order for the charge to be erased, the stored charge must be erased from the floating gate. This erasure can be achieved by exposing the EPROM to UV light for a time of up to about 20 minutes. This UV light creates a discharge path for the floating gate. EPROM cells typically consist of only one transistor making it possible to create very high-density arrays of EPROM cells. The UV light that is used to erase EPROM cells however brings with it the requirement that EPROM cells must be packaged in relatively expensive ceramic packages that contain a UV-transparent window. The devices must also, during the process of erasure, be removed from their operating environment and placed in a special UV eraser. To counter these disadvantages, electrically erasable PROM's (EEPROM's) have been created. These EEPROM devices are implemented using either floating-gate tunnel oxide (FLOTOX) MOS devices or using textured-polysilicon floating-gate MOS devices. FLOTOX MOS devices consist of a MOS transistor with two poly gates, the textured-polysilicon floating-gate MOS devices consists of three partially overlapping layers of poly creating a cell that acts as three in series connected MOS devices. In this arrangement, the floating-gate MOS device is formed in the middle of the poly structure, this device is encapsulated in $SiO_2$ in order to provide this device with high charge retention. The tunneling that is required to affect the charge transfer will, in this case, take place from one poly structure to another rather than from the substrate to the floating gate. Textured poly gates are programmed by causing electrons to flow (tunnel) from the floating poly structure to poly 3. A relatively high voltage is established on the poly 3 during both the programming and the erase operations. The drain voltage determines whether the tunneling occurs from poly 1 to the floating gate or from the floating gate to poly 3. The drain voltage therefore determines the final state of the memory cell.

Another EEPROM cell is the flash EEPROM wherein all the memory cells can be rapidly and electrically erased in one operation. This operation of memory erasure can be performed on the entire memory array or on selected parts of the memory array, down to the erasure of individual bytes within the memory array. The erasing mechanism of the flash EEPROM consists of tunneling off the region between the floating gate and the drain region of the MOS device. Programming the flash EEPROM is carried out by hot carrier injection into the gate of the MOS device. Flash EEPROM typically will use the erasure of relatively large regions of memory, the floating gate EEPROM's typically incorporate a separate select transistor, allowing for the erasure of individual bytes.

Most flash memory EEPROM devices use a double poly structure whereby the upper poly forms the control gate and the word lines of the structure while the lower poly is the floating gate. In a typical structure, the control-gate poly overlaps the channel region that is adjacent to the channel under the floating gate. The extension of the control gate over the channel region is referred to as the series enhancement-mode transistor and is required because when the cell is erased, a positive charge remains on the floating gate inverting the channel under floating gate. The series enhancement-mode transistor prevents the flow of current from the source to the drain regions of the MOS device.

For the simultaneous creation of flash memory devices in large quantities, it is of critical importance that the various elements that are comprised in the device are created in a uniform and identical manner. Specifically, the thickness of layers within the created device, such as a layer of native oxide that forms an interface between overlying layers of polysilicon, must be created within very close tolerances. The invention addresses the concern of creating a layer of native oxide of uniform thickness for batch produced flash memory devices.

U.S. Pat. No. 6,284,596 B1 (Sung et al.) shows a process for a floating gate and nitride layer.

U.S. Pat. No. 6,261,905 (Chen et al.) shows a flash memory process with a stacking gate formed by a damascene-like structure.

U.S. Pat. No. 6,242,308 B1 (Hsieh et al.) and U.S. Pat. No. 6,225,162 (Lin et al.) are related memory gate processes.

SUMMARY OF THE INVENTION

A principle objective of the invention is to enhance uniformity in thickness of created layers of native oxide.

Another objective of the invention is to remove the impact of the advancement of the processed substrate through a processing furnace on the thickness of a created layer of native oxide for a flash memory device.

Yet another objective of the invention is to improve uniformity of thickness of a deposited layer of native oxide for a flash memory device by making this deposition independent of the location or zone within a processing furnace.

A layer of gate oxide is created over the surface of a substrate, a layer of gate material is deposited over the surface of the layer of gate oxide. In a first embodiment of the invention, a layer of native oxide is grown over the surface of the layer of gate material, this layer of native oxide is used to enhance oxidation of exposed portions of the layer of gate material. In a second embodiment of the invention, enhanced oxidation of exposed portions of the layer of gate material is achieved by modifying the conventional sequence of the oxidation process. This latter modification is realized by modifying the forward motion of the substrates through the oxidation furnace or by modifying the sequence in which the substrates move through the oxidation furnace.

BRIEF DESCRIPTION OF THE DRAWINGS

FIG. 1 and FIGS. 2a through 2e show conventional methods of creating floating gates for split-gate flash memory devices.

FIG. 3a is the cross section of the surface of a substrate, layers of gate oxide, gate material, native oxide and of etch stop material have been created over the surface of the substrate, a mask of photoresist has been created over the surface of the etch stop layer.

FIG. 3b shows a cross section after the etching of the layer of etch stop material, exposing the surface of the layer of native oxide.

FIG. 3c shows a cross section after the exposed native oxide has been oxidized in combination with oxidation of the layer of gate material, creating a pattern of hardmask material over the surface of the layer of gate material.

FIG. 3d shows a cross section after the layer of gate material has been etched in accordance with the pattern of hardmask material.

DESCRIPTION OF THE PREFERRED EMBODIMENTS

Figure 3A:
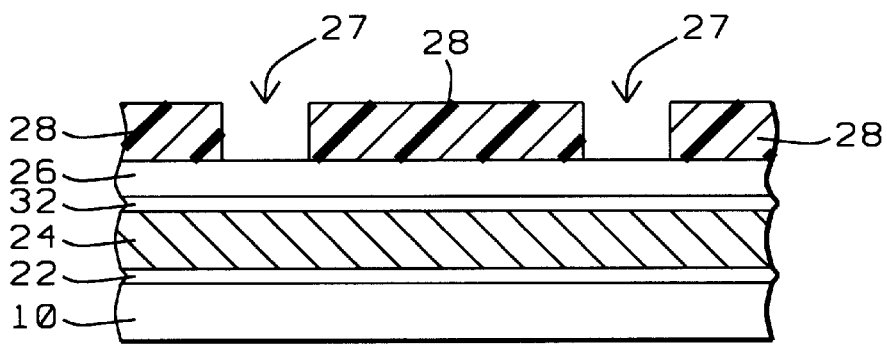
FIGS. 3a through 3d show the invention, as follows.

For improved understanding of the invention, a conventional method of creating a flash-memory device will first briefly be highlighted. Referring for this purpose first specifically to the cross section that is shown in FIG. 1, there is shown a cross section of a semiconductor substrate 10. It is well known in the art that the programming and erasing of the flash memory cell is based on the Fowler-Nordheim (F-N) tunneling effect through a layer of gate oxide. The simplified cross section of a gate electrode that is shown in FIG. 1 comprises a layer 14 of gate oxide, the floating gate 16 (typically of polysilicon and referred to as poly-1) overlying the layer 14 of gate oxide, a layer 18 of interpoly dielectric and the control gate 20 (typically of polysilicon and referred to as poly-2). Source 11 and drain 12 impurity implantations are provided self-aligned with the gate electrode into the surface of substrate 10. The channel region 13 of the device is located between the source 11 and the drain 13 impurity implantations. Substrate 10 and channel 13 are of a first conductivity type, the source and drain regions have a second conductivity type that is opposite to the first conductive type.

The cell structure that is shown in simplified form in the cross section of FIG. 1 is coded (a charge is introduced into the cell) by introducing a sufficiently high voltage difference between the control gate 20 and the drain 12 of the cell. This sufficiently high voltage results in the transfer of electrons from the channel region 13 to the floating gate 16. The floating gate 16 is sufficiently isolated so that the accumulated charge is retained for an indefinite period of time and therefore provides a coded, non-volatile memory charge. The voltage to which the control gate 20 is raised for this purpose is typically about 12 volts, the source 11 is grounded. As the electronic charge increase in the floating gate 16 of the cell, the electrical field between the floating gate 16 the substrate 10 decreases, reducing the flow of electrons to the floating gate 16. When the high voltage is removed from the control gate 20, floating gate 16 will remain charged to a voltage value that is higher than the threshold value of a logic high condition. Therefore, even if a voltage value that equals a logic high is applied to the control gate 20, the cell remains in an off condition. The charge that is accumulated on the floating gate 16 can be erased by grounding the control gate 20 and by raising the voltage on the drain 12, the stored charge on the floating gate 16 will now flow back to the substrate 10.

The thickness of the various portions of oxide layers of the stacked flash memory cell of FIG. 1 play an important part in determining such parameters as current consumption, coupling ratio and the memory erase-write speed, especially in an environment where feature size in advanced integrated circuits is reduced at a rapid rate.

To enhance the required uniformity in the creation of flash memory cells, it is of critical importance that the variation of the thickness of the various layers of oxide that are part of a flash memory cell is within strict limitations and without significant variations thereof.

The conventional methods that are typically applied for the creation of a patterned and etched layer of polysilicon, which serves as a floating gate, is-first discussed using FIGS. 2a through 2d. This processing sequence starts with a conventional semiconductor substrate 10 having been provided with passive and active regions on the surface thereof. These regions are not specifically highlighted in the cross section that is shown in FIG. 2a since these regions do not significantly contribute to an understanding of the invention. A thin layer 22 of gate oxide is first formed over the surface of substrate 10.

Gate oxide is usually formed as a silicon dioxide material but may be a composite oxide, such as TEOS and silicon dioxide, or a nitride oxide layer or a like gate dielectric. The gate oxide can be silicon dioxide, thermally grown in an oxygen-steam ambient at a temperature between 800 and 1,000 degrees C. to a thickness of about 30 to 300 Angstrom. Alternatively, other methods of oxidation can be used for the creation of layer 22 of gate oxide, such as oxidation in a dry oxygen and anhydrous hydrogen chloride in an atmospheric or low pressure environment, or in a low temperature, high pressure environment and the like.

Next, FIG. 2b, a first layer 24 of polysilicon is formed over the surface of layer 22 of gate oxide. The layer 24 of polysilicon can be deposited using methods of LPCVD at a temperature of between about 500 and 650 degrees C. to a thickness between about 2,000 and 4,000 Angstrom. The polysilicon layer 24 can be grown using in situ doping procedures by doping with arsine or phosphine in a saline ambient. The polysilicon layer 24 can also be deposited intrinsically and doped via impurity ion implant of arsenic or phosphorous, at an energy of about 30 to 75 KeV and a concentration between about 5E14 and 1E16 atoms/cm$^2$.

The creation of layer 24 of polysilicon is followed by the creation of layer 26 of silicon nitride. Silicon nitride layer 26 can be formed using any suitable technique including CVD techniques, such as LPCVD of PECVD. In one embodiment, the silicon nitride is made using one step PECVD or LPCVD techniques such as simultaneously employing gasses containing silicon and nitrogen, such as using $SiH_4$ of $SiCl_2H_2$ and $N_2$ or $NH_3$. In another embodiment, the silicon nitride layer is made using LPCVD techniques, applying $SiCl_2H_2$ and $NH_3$ and $Si_3N_4$. Layer 26 if silicon nitride is preferably formed to a thickness of between about 800 and 1,200 Angstrom.

As a final step of the cross section that is shown in FIG. 2b, a layer 28 of photoresist is deposited over the surface of the layer 26 of silicon nitride, the layer 28 of photoresist is patterned and developed using conventional methods of photolithography and exposure. The patterned and developed layer 28 of photoresist forms a photoresist mask overlying the layer 26 of silicon nitride. Openings 27, created through the photoresist mask 28, expose the surface of layer 26 where this surface aligns with the surface regions of layer 24 where patterned layers of poly-1 are to be created for the floating gates of a flash memory device.

The mask 28 of photoresist that is shown in cross section in FIG. 2b is used to etch layer 24 of silicon nitride, creating openings 29, FIG. 2c, through the layer 26 that expose the surface of layer 24 of poly-1 where the floating gates of the flash memory are to be created. The preferred method of the invention for the etch of the layer 26 of silicon nitride is a dry etch such as applying an RIE etch using $CHF_3$ or $SF_6$—$O_2$ as an etchant.

The cross section that is shown in FIG. 2c further shows that the photoresist mask 28 has been removed from the surface, this can be performed using conventional methods of oxygen plasma ashing.

The layer 24 of polysilicon is then oxidized over the surface regions of layer 24 where this surface is exposed in the bottom of openings 29, this oxidation is a wet oxidation process at a temperature between about 800 to 900 degrees C. The process of creating the oxidized surface regions 30 of layer 24 is a conventional process that compares with the process of "local oxidation of silicon" or LOCOS process.

The patterned layer 26 of silicon nitride can now be removed, this can be done by dipping the structure in a hot phosphoric acid ($H_3PO_4$) solution, which is a standard wet nitride removal process.

Layers 30, which comprises a poly-oxide, are now used as a hard mask for the etching of layer 24 of poly-1, creating the floating gates of a flash memory cell, as shown in cross section in FIG. 2e. The etching of layer 24 of polysilicon can be accomplished by using an anisotropic plasma etch, for example a Reactive Ion Etch (RIE), using as etchant gasses a gas such as hydrogen bromide (HBr) or chlorine ($Cl_2$) and a carrier gas such as argon (Ar) with as preferred gasses $SF_6$ and HBr.

The above highlighted processing steps can be summarized as follow:

providing a silicon substrate creating a layer of pad oxide over the surface of the substrate creating a layer of polysilicon over the surface of the layer of pad oxide creating a mask of silicon nitride over the surface of the layer of polysilicon, exposing the layer of polysilicon where a floating gate needs to be created oxidizing the exposed surface of the layer off polysilicon, creating a pattern of (LOCOS-like shaped) poly-oxide aligned with the surface region of the layer of polysilicon where a floating gate is to be created removing the silicon nitride mask, and etching the layer of polysilicon in accordance with the pattern of poly-oxide.

Using the above detailed sequence of creating a floating gate for a flash memory cell its has been found that the formation of the layer 30 results in non-uniform creation of the floating gates. This step, as highlighted above, requires the creation of a mask (26, FIG. 2c) for the oxidation of the layer of poly-1. The steps that are required for the creation of the hard mask 30 have been isolated and have been identified as the steps that seem to introduce the cited non-uniformity in the creation of the floating gate. The flash memory ability to erase the charge contained in the EEPROM device has been successfully correlated with the thickness of the layer 30 of poly-oxide that forms the hard mask for the etch of the layer 24 of poly-1. The invention therefore provides for improving the creation of native oxide hard-mask 30, FIG. 2d, that is used for the etching of the layer 24 of poly-1.

Two alternate methods are provided by the invention for this purpose, as follows:

1. a new and additional thin layer of oxide is created over the surface of the layer of poly-1, interspersed between the layer of poly-1 and the thereover created etch mask of silicon nitride, and 2. the sequence inwhich the wafer are processed through the nitride furnace is altered, effectively providing the same benefit as the benefit that is derived by providing a thin layer of oxide over the surface of the layer of poly-1.

The first of these two alternate methods is highlighted using FIGS. 3a through 3d. This will be done without referring to and further identifying the processing conditions that lead to the creation of the various layers, since these processing conditions remain the same as the processing conditions highlighted for FIGS. 2a through 2e.

FIG. 3a shows:

10, the surface of a-silicon substrate 22, a thin layer of gate oxide formed over the surface of silicon substrate 10; layer 22 of gate oxide is preferably grown to a thickness of between about 30 to 300 Angstrom 24, a layer of polysilicon formed over the surface of layer 22 of gate oxide; the layer 24 of gate material such as polysilicon is preferably deposited to a thickness between about 2,000 and 4,000 Angstrom 32, in significant variance with the previously highlighted processing cycle of FIGS. 2a through 2e, a thin layer of oxide created over the surface of layer 24 of poly-1; conventional methods of oxidation are used for the creation of layer 32; layer 32 of native oxide is preferably grown to a thickness of between about 30 to 300 Angstrom 26, a layer of silicon nitride formed over the surface of the layer 32 of oxide; layer 26, of etch stop material such as silicon nitride, is preferably formed to a thickness of between about 800 and 1,200 Angstrom 28, a photoresist mask created over the surface of the layer 26 of silicon nitride, the layer 28 of photoresist is patterned and developed using conventional methods of photolithography and exposure. The patterned and developed layer 28 of photoresist forms a photoresist mask overlying the layer 26 of silicon nitride. Openings 27 created through this mask 28 of photoresist expose the surface of layer 26 in alignment with the surface regions of layer 22 of poly-1 where the patterned layers of poly-1 are to be created for the floating gates of a flash memory device.

Figure 3B:
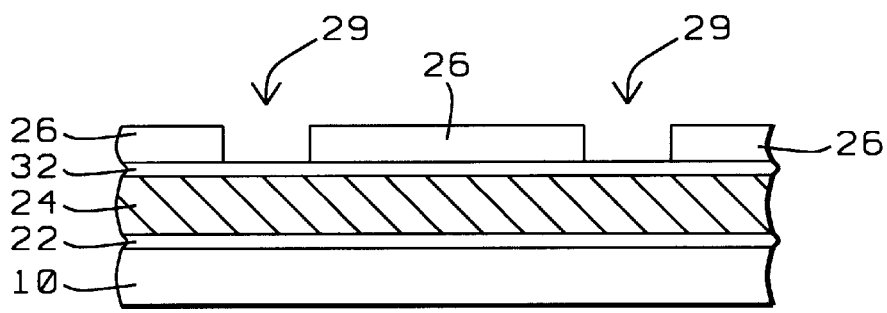

FIG. 3b shows a cross section where the layer 26 of silicon nitride has been etched in accordance with the mask 28 of photoresist, exposing the surface of layer 32 of oxide over surface areas of layer 32 that align with the surface areas of layer 22 where floating gates of the flash memory cell are to be created, The photoresist mask 28, FIG. 3a, has been removed from the surface.

Figure 3C:
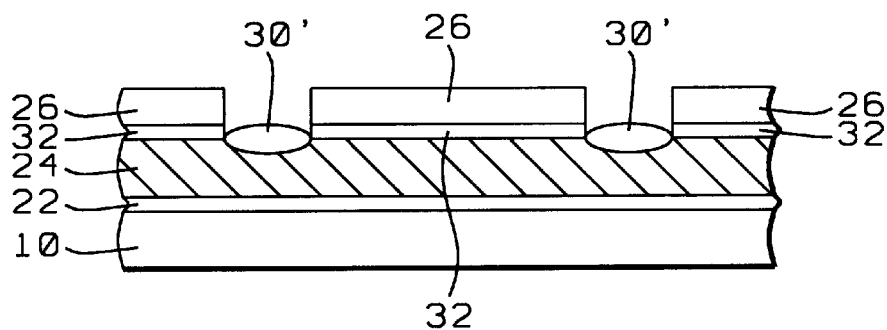

FIG. 3c shows a cross section after layers 32 of oxide and layer 24 of polysilicon have been oxidized over the surface regions of this layer where this surface is exposed in the bottom of openings 29, creating layer 30' of poly-oxide. The oxidation of layers 32 and 24 is a wet oxidation process at a temperature between about 800 and 900 degrees C.

Figure 3D:
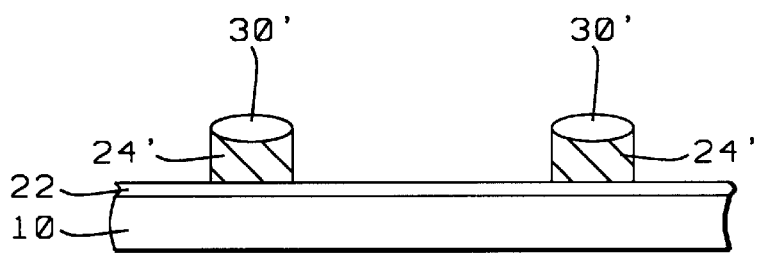

The cross section of FIG. 3d shows that the patterned layer 26, FIG. 3c, of silicon nitride has been removed from the surface. The layer 24 of poly-1 has seen etched in accordance with the created layers 30' of poly-oxide, creating floating gates 24'.

The provided layer 32 of, oxide has been found to eliminate the previously experienced lack of uniformity of the created floating gates (24, FIG. 2e) and has resulted in creating floating gate 24', FIG. 3d, of uniform performance characteristics. Floating gates 24', FIG. 3d, have been obtained by etching the layer 24 in accordance with the pattern of oxidized surface regions 30' created over the surface of layer 24. Surface regions 30' serve as a hardmask layer for the etch of layer 24 of gate material.

The etching of layer 24 of polysilicon can be accomplished by using an anisotropic plasma etch, for example a Reactive Ion Etch (RIE), using as etchant gasses a gas such as hydrogen bromide (HBr) or chlorine ($Cl_2$) and a carrier gas such as argon (Ar) with as preferred gasses $SF_6$ and HBr.

Flash memory cells have experimentally been completed (not shown), using the floating gate 24', FIG. 3d, as floating gates. For these latter flash memory cells, the erase characteristics of the completed flash memory cells have been evaluated. The highlighted method of providing a thin layer of oxide between the created layer of poly-1 and the overlying layer of silicon nitride has resulted in a gain of about 10% of the created flash memory cells. This gain has been confirmed as being attributable to the above highlighted processing sequence of the invention.

The second, alternate method that has been highlighted above, that is altering the sequence in which wafers are processed through a nitride furnace, effectively provides the same benefit as the benefit that is derived by providing the thin second layer of oxide over the surface of the layer of poly-1. This is highlighted next.

Wafers are conventionally processed through processing chambers in a batch mode, whereby the wafers are stored in wafer containers or boats. For a typical process, a wafer boat contains multiple wafers whereby the wafers are divided in groups, each group containing for instance six wafers. The processing furnace is, in a vertical direction, divided into processing zones, such as, proceeding from a lowest zone to an upper, zone, that is from zone L (Lowest) through zone C (Center) to zone U Upper).

Several related parameters are of importance in this respect:

memory cell erase performance, a parameter referred to as Flash Erase Voltage or FEV, which is measured in completed flash memory devices, and the correlation of the processing zones (L, C and U) with the value of FEV.

Figure 4:
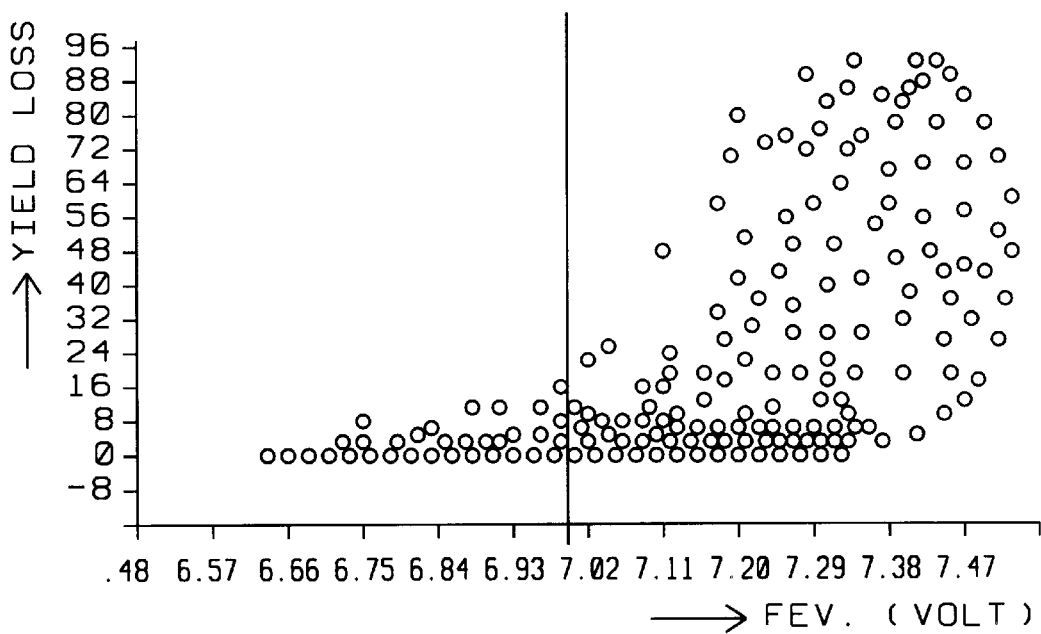
FIGS. 4 and 5 shows experimental results in support of the invention.

FIG. 4 shows the effect that the value of FEV has on device yield. The value of FEV is plotted along the horizontal or X-axis, the yield loss is plotted along the vertical or Y-axis. From this it is clear that for a value of FEV that is larger than 7.0 volts, the device yield loss increase dramatically. From this it can be derived that it is desirable, from a device yield point of view, to maintain or strive for a value for FEV that is less than 7.0 volts.

Figure 5:
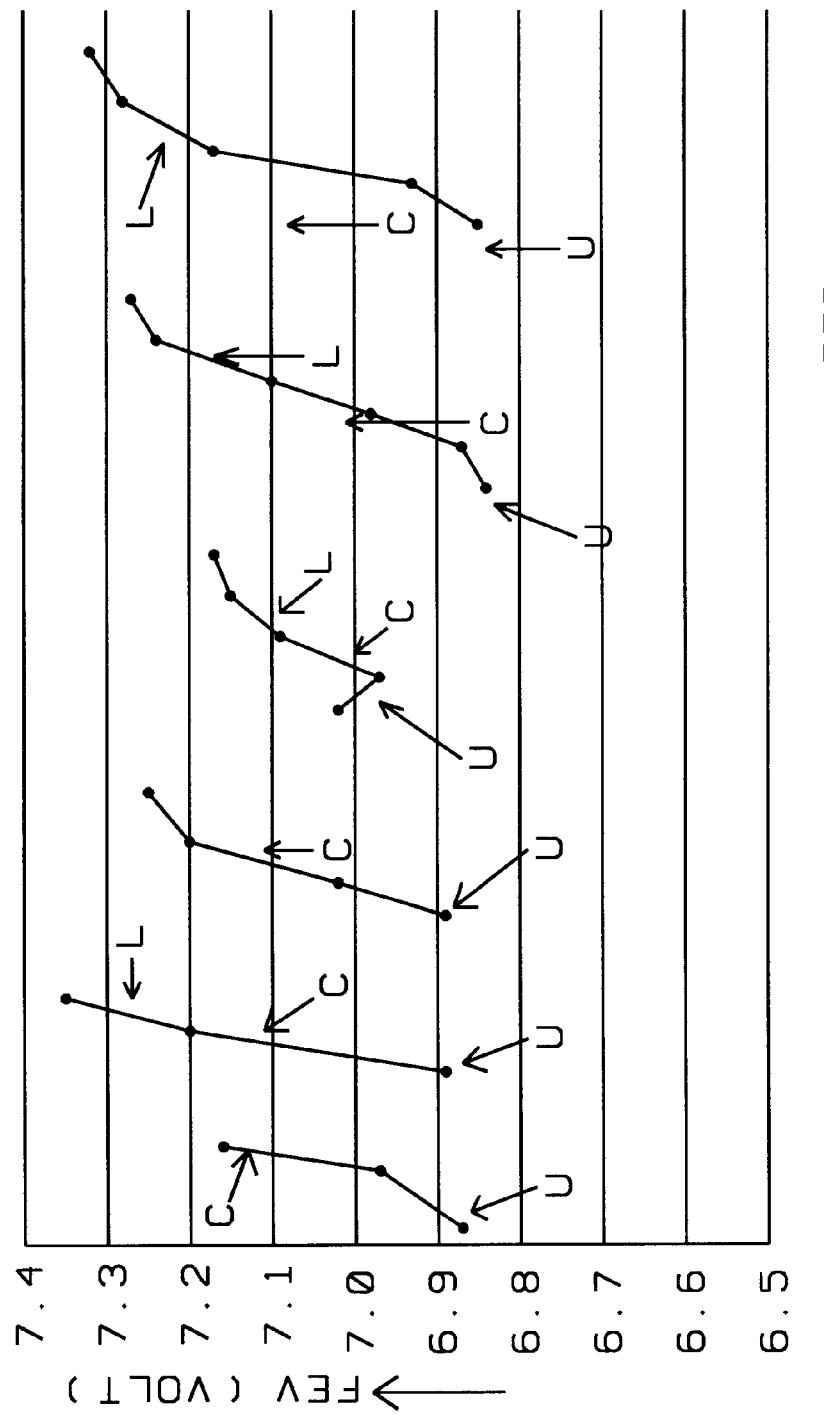

The impact of the previously highlighted location of the processed wafer with respect to the zones (L, C or U) in a processing furnace is highlighted in the graphic presentation of FIG. 5. Along the horizontal or X-axis are represented the various wafers or lot numbers that have been used for this experiment. Along the vertical or Y-axis are shown the values of FEV that have been measured based on the zone in which the processing of the flash memory cell has taken place. From this it is clear that zones that are located higher in the processing furnace, such as zone U, are prone to create flash cell memory devices (based on the previously indicated non-uniformity of the creation of the floating gate electrode) that have a value of FEV that exceeds 7.0 volts. This latter value for FEV, based on the graphic representation of FIG. 5, results in higher yield loss and must therefore be avoided or be compensated for. The invention provides a method that compensates for this unfavorable impact that the location or zone has on device yield. Since devices move in a continuous stream through a processing chamber, this is not a matter of regulating wafer flow through the processing tool on a per zone basis. This must be implemented by regulating the overall flow of the wafer, all wafers being processed in a lot or batch mode in a wafer carrier of boat, through the processing chamber. The objective of this regulation is to assure that the impact that the location of the wafer within the processing chamber has on device yield is minimized.

From the graphic deposition that is shown in FIG. 5, it is clear that the wafer that are predominantly processed in zone U have a lower value of FEV, which means that these wafers have a better yield (see FIG. 4). The wafers that are predominantly processed in zone U have been observed to gain more native oxide (the effect achieved with layer 32 of native oxide, FIG. 3a). It is therefore of (yield) advantage to place the emphasis on having the wafer exposed in the upper zones U in preference over the lower zones L of the processing chamber.

The invention therefore provides for controlling the steps that are required to move the wafer through the processing chamber. Specifically, the invention provides for adding a dummy step to the steps of cycling wafer through the processing chamber, this dummy step has as objective to assure a "longer stay" of the processed wafers as these wafers proceed to the upper extremity of the processing chamber. The dummy step of the invention is the addition of a boat-up and a boat-down step to the conventional steps of processing a wafer through the chamber. This dummy step then assures prolonged presence of the processed wafer most significantly in the upper regions of the processing chamber. In addition, before the dummy step of the invention is performed, the position of the wafers within a batch of wafers is altered and typically reversed. As an example, assuming that the wafers are mounted inside the wafer boat in batches, each batch containing six wafer. These wafer are numbered sequential from a lower position number 1 to an upper position number 6. Therefore, before the dummy step of the invention is performed, the wafer in location number 1 is placed in location number 6, the wafer in location number 2 is placed in location number 5, etc. This further assures that the wafers that before the dummy step is executed were for instance in the upper region of the processing chamber, get as yet an additional stay in the upper region of the processing chamber by being moved further down in the boat location. For instance, the wafer number 1 that before the dummy step was located in the upper location of the batch of six, and which therefore has already proceeded through the (favorable, from a point of view of creating high yield wafers) upper region of the surface, now gets placed down to the sixth or lower position of the batch and again is processed through the upper region of the processing chamber, amplifying the beneficial effect that the upper region has on product yield (see FIG. 5).

After the wafers have been moved through the processing chamber in the manner of the second embodiment of the invention, the processing steps of removing the silicon nitride mask, and etching the layer of polysilicon in accordance with the pattern of poly-oxide are performed.

The first embodiment of the invention, of creating floating gates for split-gate flash memory devices, can be summarized as follows:

providing a semiconductor substrate creating a first layer of gate oxide over the surface of the substrate depositing a layer of gate material comprising polysilicon, that can be oxidized over the surface of the first layer of gate oxide creating a second layer of native oxide over the surface of the layer of gate material depositing a layer of etch stop material over the surface of the second layer of native oxide patterning and etching the layer of etch stop material, creating openings through the layer of etch stop material exposing surface of the second layer of native oxide, the exposed surface of the second layer of native oxide overlying surface regions of the layer of gate material where floating gates are to be created first oxidizing the exposed surface of the second layer of native oxide, the first oxidizing further second oxidizing the layer of gate material in a pattern of the openings created through the layer of etch stop material, creating a pattern of oxidized gate material over the surface of the layer of gate material removing the patterned and etched layer of etch stop material from the surface of the second layer of native oxide etching the second layer of native oxide and the layer of gate material in accordance with the pattern of oxidized gate material created over the surface of the layer of gate material, and the first and second oxidizing can be end-point controlled or can be a timed oxidation process.

The second embodiment of the invention, of creating floating gates for split-gate flash memory devices, can be summarized as follows:

providing at multiplicity of substrates having substrate numbers, the multiplicity of substrates having been provided with a layer of gate oxide over the surface of the substrates, the multiplicity of substrates further having been provided with a layer of polysilicon deposited over the surface of the layer of gate oxide, the multiplicity of substrates further having been provided with a patterned and etched layer of etch stop material over the surface of the layer of gate material, openings through the layer of etch stop material exposing the surface of the layer of gate material, the exposed surface of the layer of polysilicon being surface regions of the layer of polysilicon where floating gates are to be created providing an oxidizing furnace having an entry port and an exit port providing a substrate boat having boat location numbers, the boat location numbers being representative of the relative positioning of one substrate of the multiplicity of substrates with respect to all other substrates of the multiplicity of substrates, the boat location numbers being whole numbers arranged in incremental and sequential order, a boat location number having a higher value being representative of a boat location that is closer to the exit port, a boat location number having a lower value being representative of a boat location that is closer to the entry port positioning the multiplicity of substrates inside the substrate boat by matching substrate numbers with boat location numbers in a first order positioning the substrate boat inside the oxidizing chamber processing the multiplicity of substrates in the oxidizing furnace in the first order by advancing the multiplicity of substrates from the entry port to the exit port in a first mode of advancement, oxidizing the exposed surface of the layer of gate material terminating the first mode of advancement, the termination being performed prior to completion of the processing of the multiplicity of substrates in the oxidizing furnace removing the substrate boat from the oxidizing furnace, thereby removing the multiplicity of substrates from the oxidizing furnace positioning the multiplicity of substrates inside the substrate boat by matching substrate numbers with boat location numbers in a second order, the second order being different from and being related to the first order in accordance with an equation re-positioning the substrate boat inside the oxidizing chamber resuming processing in the first mode of advancement the multiplicity of substrates in the oxidizing furnace in the second order by advancing the multiplicity of substrates from the entry port to the exit port in the first mode of advancement, further oxidizing the exposed surface of the layer of gate material, and the processing the multiplicity of substrates in said oxidizing furnace being end-point controlled or can be a timed oxidation process.

Additional steps of the second embodiment of the invention can be summarized as follows:

terminating processing in the first mode of advancement the multiplicity of substrates in a second order, the termination to be performed prior to completion of the processing of the multiplicity of substrates in the oxidizing furnace removing a subportion of the multiplicity of substrates from the oxidizing furnace removing the patterned and etched layer of etch stop material from the surface of the layer of polysilicon provided over the surface of the layer of gate oxide of the sub-portion of substrates, and etching the layer of polysilicon provided over the surface of the layer of gate oxide of the sub-portion of substrates in accordance with the oxidized exposed surface of the layer of gate material.

Further additional steps of the second embodiment of the invention can be summarized as follows:

processing the multiplicity of substrates in the oxidizing furnace in the second order by advancing the multiplicity of substrates in a second mode of advancement, the second mode of advancement comprising advancing the multiplicity of substrates from the exist port to the entry port over a measurable distance, the additional step to be performed prior to the step of resuming processing in the first mode of advancement the multiplicity of substrates in the oxidizing furnace in a second order.

The invention in sum advantageously provides for:

the beneficial effects of an additional layer of native oxide over the surface of the layer of poly-1 for the creation of a layer of hard mask that is used for the creation of a floating gate electrode, and the beneficial effects of positioning the wafers inside and moving the wafers through a processing chamber in accordance with a scheme during processing of the wafer.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of creating floating gates for split-gate flash memory devices, comprising the steps of:

providing a semiconductor substrate;

creating a first layer of gate oxide over the surface of said substrate;

depositing a layer of gate material that can be oxidized over the surface of said first layer of gate oxide;

creating a second layer of native oxide over the surface of said layer of gate material;

depositing a layer of etch stop material over the surface of said second layer of native oxide;

patterning and etching said layer of etch stop material, creating openings through said layer of etch stop material exposing the surface of said second layer of native oxide, said exposed surface of said second layer of native oxide overlying surface regions of said layer of gate material where floating gates are to be created;

first oxidizing the exposed surface of said second layer of native oxide, said first oxidizing further second oxidizing said layer of gate material in a pattern of said openings created through said layer of etch stop material, creating a pattern of oxidized gate material over the surface of said layer of gate material;

removing said patterned and etched layer of etch stop material from the surface of said second layer of native oxide; and etching said second layer of native oxide and said layer of gate material in accordance with said pattern of oxidized gate material created over the surface of said layer of gate material.

2. The method of claim 1, said first layer of gate oxide preferably being grown to a thickness of between about 30 to 300 Angstrom.

3. The method of claim 1, said layer of gate material comprising polysilicon.

4. The method of claim 1, said layer of gate material being deposited to a thickness between about 2,000 and 4,000 Angstrom.

5. The method of claim 1, said second layer of native oxide preferably being grown to a thickness between about 30 to 300 Angstrom.

6. The method of claim 1, said layer of etch stop material comprising silicon nitride.

7. The method of claim 1, said layer of etch stop material being deposited to a thickness between about 800 and 1,200 Angstrom.

8. The method of claim 1, said first and second oxidizing comprising a wet oxidation process at a temperature between about 800 to 900 degrees C.

9. The method of claim 1, said first and second oxidizing being end-point controlled.

10. The method of claim 1, said first and second oxidizing being a timed oxidation process.

11. The method of claim 1, said etching said second layer of native oxide and said layer of gate material comprising anisotropic plasma etch.

12. The method of claim 11, said anisotropic plasma etch comprising a Reactive Ion Etch (RIE), using hydrogen bromide (HBr) or chlorine ($Cl_2$) as etchant gasses, further using argon (Ar) as a carrier gas.

13. A method of creating floating gates for split-gate flash memory devices, comprising the steps of:

providing a semiconductor substrate;

creating a first layer of gate oxide over the surface of said substrate;

depositing a layer of polysilicon over the surface of said first layer of gate oxide;

creating a second layer of native oxide over the surface of said layer of polysilicon;

depositing a layer of etch stop material over the surface of said second layer of native oxide;

patterning and etching said layer of etch stop material, creating openings through said layer of etch stop material exposing the surface of said second layer of native oxide, said exposed surface of said second layer of native oxide overlying surface regions of said layer of gate material where floating gates are to be created;

first oxidizing the exposed surface of said second layer of native oxide, said first oxidizing further second oxidizing said layer of polysilicon in a pattern of said openings created through said layer of etch stop material, creating a pattern of oxidized polysilicon over the surface of said layer of polysilicon;

removing said patterned and etched layer of etch stop material from the surface of said second layer of native oxide; and etching said second layer of native oxide and said layer of polysilicon in accordance with said pattern of oxidized polysilicon created over the surface of said layer of polysilicon.

14. The method of claim 13, said first layer of gate oxide preferably being grown to a thickness between about 30 to 300 Angstrom.

15. The method of claim 13, said layer of polysilicon being deposited to a thickness between about 2,000 and 4,000 Angstrom.

16. The method of claim 13, said second layer of native oxide preferably being grown to a thickness of between about 30 to 300 Angstrom.

17. The method of claim 13, said layer of etch stop material comprising silicon nitride.

18. The method of claim 13, said layer of etch stop material being deposited to a thickness of between about 800 and 1,200 Angstrom.

19. The method of claim 13, said first and second oxidizing comprising a wet oxidation process at a temperature between about 800 to 900 degrees C.

20. The method of claim 13, said first and second oxidizing being end-point controlled.

21. The method of claim 13, said first and second oxidizing being a timed oxidation process.

22. The method of claim 13, said etching said second layer of native oxide and said layer of gate material comprising anisotropic plasma etch.

23. The method of claim 22, said anisotropic plasma etch comprising a Reactive Ion Etch (RIE), using hydrogen bromide (HBr) or chlorine ($Cl_2$) as etchant gasses, further using argon (Ar) as a carrier gas.

24. A method of creating floating gates for split-gate flash memory devices, comprising the steps of:

providing at multiplicity of substrates having substrate numbers, said multiplicity of substrates having been provided with a layer of gate oxide over the surface of said substrates, said multiplicity of substrates further having been provided with a layer of gate material deposited over the surface of said layer of gate oxide, said multiplicity of substrates further having been provided with a patterned and etched layer of etch stop material over the surface of said layer of gate material, openings through said layer of etch stop material exposing the surface of said layer of gate material, said exposed surface of said layer of gate material being surface regions of said layer of gate material where floating gates are to be created;

providing an oxidizing furnace having an entry port and an exit port;

providing a substrate boat having boat location numbers, said boat location numbers being representative of the relative positioning of one substrate of said multiplicity of substrates with respect to all other substrates of said multiplicity of substrates, said boat location numbers being whole numbers arranged in incremental and sequential order, a boat location number having a higher value being representative of a boat location that is closer to said exit port, a boat location number having a lower value being representative of a boat location that is closer to said entry port;

positioning said multiplicity of substrates inside said substrate boat by matching substrate numbers with boat location numbers in a first order;

positioning said substrate boat inside said oxidizing chamber;

processing said multiplicity of substrates in said oxidizing furnace in said first order by advancing said multiplicity of substrates from said entry port to said exit port in a first mode of advancement, oxidizing said exposed surface of said layer of gate material;

terminating said first mode of advancement, said termination being performed prior to completion of said processing of said multiplicity of substrates in said oxidizing furnace;

removing said substrate boat from said oxidizing furnace, thereby removing said multiplicity of substrates from said oxidizing furnace;

positioning said multiplicity of substrates inside said substrate boat by matching substrate numbers with boat location numbers in a second order, said second order being different from and being related to said first order in accordance with an equation;

re-positioning said substrate boat inside said oxidizing chamber; and resuming processing in said first mode of advancement said multiplicity of substrates in said oxidizing furnace in said second order by advancing said multiplicity of substrates from said entry port to said exit port in said first mode of advancement, further oxidizing said exposed surface of said layer of gate material.

25. The method of claim 24, said layer of gate oxide provided over the surface of said multiplicity of substrates being grown to a thickness between about 30 to 300 Angstrom.

26. The method of claim 24, said layer of gate material comprising polysilicon.

27. The method of claim 24, said layer of gate material provided over the surface of said multiplicity of substrates being between about 2,000 and 4,000 Angstrom thick.

28. The method of claim 24, said layer of etch stop material provided over the surface of said multiplicity of substrates comprising silicon nitride.

29. The method of claim 24, said layer of etch stop material provided over the surface of said multiplicity of substrates being provided to a thickness of between about 800 and 1,200 Angstrom.

30. The method of claim 24, said processing said multiplicity of substrates in said oxidizing furnace comprising a wet oxidation process at a temperature between about 800 to 900 degrees C.

31. The method of claim 24, said processing said multiplicity of substrates in said oxidizing furnace being end-point controlled.

32. The method of claim 24, said processing said multiplicity of substrates in said oxidizing furnace being a timed oxidation process.

33. The method of claim 24, additionally comprising the steps of:

terminating processing in said first mode of advancement said multiplicity of substrates in a second order, said termination to be performed prior to completion of said processing of said multiplicity of substrates in said oxidizing furnace;

removing a sub-portion of said multiplicity of substrates from said oxidizing furnace;

removing said patterned and etched layer of etch stop material from the surface of said layer of gate material provided over the surface of said layer of gate oxide of said sub-portion of substrates; and etching said layer of gate material provided over the surface of said layer of gate oxide of said sub-portion of substrates in accordance with said oxidized exposed surface of said layer of gate material.

34. The method of claim 33, said etching said layer of gate material comprising anisotropic plasma etch.

35. The method of claim 34, said anisotropic plasma etch comprising a Reactive Ion Etch (RIE), using hydrogen bromide (HBr) or chlorine ($Cl_2$) as etchant gasses, further using argon (Ar) as a carrier gas.

36. The method of claim 24 with an additional step of processing said multiplicity of substrates in said oxidizing furnace in said second order by advancing said multiplicity of substrates in a second mode of advancement, said second mode of advancement comprising advancing said multiplicity of substrates from said exist port to said entry port over a measurable distance, said additional step to be performed prior to said step of resuming processing in said first mode of advancement said multiplicity of substrates in said oxidizing furnace in a second order.

37. A method of creating floating gates for split-gate flash memory devices, comprising the steps of:

providing at multiplicity of substrates having substrate numbers, said multiplicity of substrates having been provided with a layer of gate oxide over the surface of said substrates, said multiplicity of substrates further having been provided with a layer of polysilicon deposited over the surface of said layer of gate oxide, said multiplicity of substrates further having been provided with a patterned and etched layer of etch stop material over the surface of said layer of gate material, openings through said layer of etch stop material exposing the surface of said layer of gate material, said exposed surface of said layer of polysilicon being surface regions of said layer of polysilicon where floating gates are to be created;

providing an oxidizing furnace having an entry port and an exit port;

providing a substrate boat having boat location numbers, said boat location numbers being representative of the relative positioning of one substrate of said multiplicity of substrates with respect to all other substrates of said multiplicity of substrates, said boat location numbers being whole numbers arranged in incremental and sequential order, a boat location number having a higher value being representative of a boat location that is closer to said exit port, a boat location number having a lower value being representative of a boat location that is closer to said entry port;

positioning said multiplicity of substrates inside said substrate boat by matching substrate numbers with boat location numbers in a first order;

positioning said substrate boat inside said oxidizing chamber;

processing said multiplicity of substrates in said oxidizing furnace in said first order by advancing said multiplicity of substrates from said entry port to said exit port in a first mode of advancement, oxidizing said exposed surface of said layer of gate material;

terminating said first mode of advancement, said termination being performed prior to completion of said processing of said multiplicity of substrates in said oxidizing furnace;

removing said substrate boat from said oxidizing furnace, thereby removing said multiplicity of substrates from said oxidizing furnace;

positioning said multiplicity of substrates inside said substrate boat by matching substrate numbers with boat location numbers in a second order, said second order being different from and being related to said first order in accordance with an equation;

re-positioning said substrate boat inside said oxidizing chamber; and resuming processing in said first mode of advancement said multiplicity of substrates in said oxidizing furnace in said second order by advancing said multiplicity of substrates from said entry port to said exit port in said first mode of advancement, further oxidizing said exposed surface of said layer of gate material.

38. The method of claim 37, said layer of gate oxide provided over the surface of said multiplicity of substrates being grown to a thickness between about 30 to 300 Angstrom.

39. The method of claim 37, said layer of polysilicon provided over the surface of said multiplicity of substrates being between about 2,000 and 4,000 Angstrom thick.

40. The method of claim 37, said layer of etch stop material provided over the surface of said multiplicity of substrates comprising silicon nitride.

41. The method of claim 37, said layer of etch stop material provided over the surface of said multiplicity of substrates being provided to a thickness of between about 800 and 1,200 Angstrom.

42. The method of claim 37, said processing said multiplicity of substrates in said oxidizing furnace comprising a wet oxidation process at a temperature between about 800 to 900 degrees C.

43. The method of claim 37, said processing said multiplicity of substrates in said oxidizing furnace being end-point controlled.

44. The method of claim 37, said processing said multiplicity of substrates in said oxidizing furnace being a timed oxidation process.

45. The method of claim 37, additionally comprising the steps of:

terminating processing in said first mode of advancement said multiplicity of substrates in a second order, said termination to be performed prior to completion of said processing of said multiplicity of substrates in said oxidizing furnace;

removing a sub-portion of said multiplicity of substrates from said oxidizing furnace;

removing said patterned and etched layer of etch stop material from the surface of said layer of polysilicon provided over the surface of said layer of gate oxide of said sub-portion of substrates; and etching said layer of polysilicon provided over the surface of said layer of gate oxide of said sub-portion of substrates in accordance with said oxidized exposed surface of said layer of gate material.

46. The method of claim 45, said etching said layer of polysilicon comprising anisotropic plasma etch.

47. The method of claim 46, said anisotropic plasma etch comprising a Reactive Ion Etch (RIE), using hydrogen bromide (HBr) or chlorine ($Cl_2$) as etchant gasses, further using argon (Ar) as a carrier gas.

48. The method of claim 37 with an additional step of processing said multiplicity of substrates in said oxidizing furnace in said second order by advancing said multiplicity of substrates in a second mode of advancement, said second mode of advancement comprising advancing said multiplicity of substrates from said exist port to said entry port over a measurable distance, said additional step to be performed prior to said step of resuming processing in said first mode of advancement said multiplicity of substrates in said oxidizing furnace in a second order.

* * * * *